(12) United States Patent
Lim et al.

(10) Patent No.: US 8,279,678 B2
(45) Date of Patent: Oct. 2, 2012

(54) METHOD OF PERFORMING PROGRAM VERIFICATION OPERATION USING PAGE BUFFER OF NONVOLATILE MEMORY DEVICE

(75) Inventors: Kyu Hee Lim, Seoul (KR); Seong Je Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 344 days.

(21) Appl. No.: 12/764,398

(22) Filed: Apr. 21, 2010

(65) Prior Publication Data

US 2010/0329028 A1 Dec. 30, 2010

(30) Foreign Application Priority Data

Jun. 29, 2009 (KR) .................. 10-2009-0058448

(51) Int. Cl.
*G11C 16/06* (2006.01)

(52) U.S. Cl. .................. 365/185.22; 365/185.25

(58) Field of Classification Search .................. None
See application file for complete search history.

(56) References Cited

U.S. PATENT DOCUMENTS

| | | | | |
|---|---|---|---|---|
| 7,099,213 B2* | 8/2006 | Ju | | 365/203 |
| 7,706,190 B2* | 4/2010 | Yang et al. | | 365/185.22 |
| 7,848,150 B2* | 12/2010 | Lee et al. | | 365/185.22 |
| 8,018,775 B2* | 9/2011 | Oh | | 365/185.22 |
| 8,027,201 B2* | 9/2011 | Lee | | 365/185.21 |

FOREIGN PATENT DOCUMENTS

KR 1020080063599 7/2008

OTHER PUBLICATIONS

Notice of Allowance issued from Korean Intellectual Property Office on Mar. 2, 2011.

* cited by examiner

*Primary Examiner* — Tan T. Nguyen
(74) *Attorney, Agent, or Firm* — IP & T Group LLP

(57) ABSTRACT

A method of performing a program verification operation in a nonvolatile memory device includes storing program data, programmed into a selected memory cell of a memory cell block, in a page buffer which is coupled to a bit line of the memory cell block via a sense node, controlling a voltage level of the sense node in response to a value of the program data, changing the voltage level of the sense node in response to a program state of the selected memory cell coupled to the bit line, and performing a program verification operation on the selected memory cell by sensing the voltage level of the sense node.

12 Claims, 3 Drawing Sheets

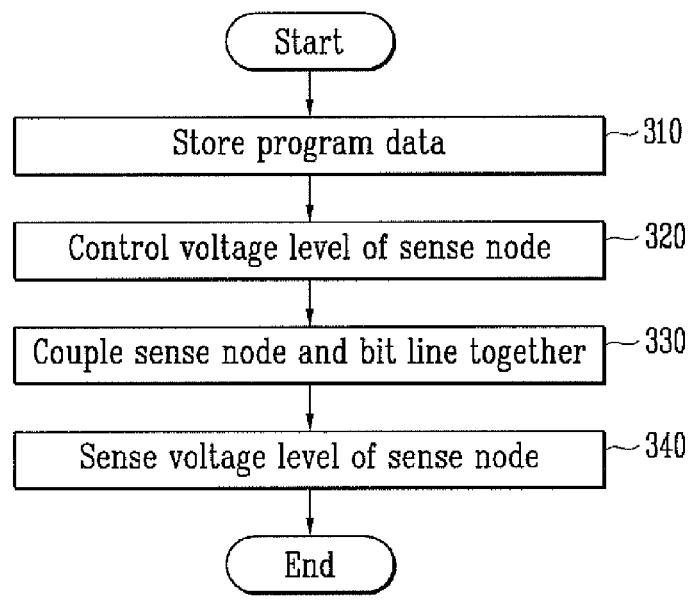

METHOD OF PERFORMING PROGRAM VERIFICATION OPERATION USING PAGE BUFFER OF NONVOLATILE MEMORY DEVICE

CROSS-REFERENCE TO RELATED APPLICATION

Priority to Korean patent application number 10-2009-0058448 filed on Jun. 29, 2009, the entire disclosure of which is incorporated by reference herein, is claimed.

BACKGROUND

Exemplary embodiments relate to a method of performing a program verification operation using a page buffer of a nonvolatile memory device and, more particularly, to the page buffer of a nonvolatile memory device and a method of performing a program verification operation using the same, which are capable of reducing the consumption of current by controlling a bit line precharge operation during a program verification operation performed on program-inhibited cells.

There has been an increasing demand for nonvolatile memory devices which can be electrically programmed and erased and which do not require the refresh function of rewriting data at specific intervals. Here, the term 'program' refers to an operation of writing data into a memory cell.

To increase the degree of integration of memory devices, there has been developed a NAND type flash memory device in which a number of memory cells are coupled in series together (the drain or the source of a transistor contained in each cell is shared by neighboring memory cells), thus forming one string. The NAND type flash memory device, unlike a NOR type flash memory device, is a memory device configured to sequentially read information.

FIG. 1 is a diagram illustrating a page buffer of a known nonvolatile memory device and a method of performing a program verification operation using the same.

Referring to FIG. 1, a sense node SO is precharged to a high voltage level using a precharge unit 20. The sense node SO and a bit line BL are coupled together using a bit line selection unit 10. Thus, the bit line BL is also precharged to a high voltage level (①). Here, a verification voltage is supplied to a memory cell selected from a number of memory cells coupled to the bit line BL, and a pass voltage is supplied to the remaining unselected memory cells. If the selected memory cell is programmed to have an increased threshold voltage, the corresponding memory cell becomes an off-cell, and so the bit line BL coupled to the selected memory cell maintains the high voltage level. However, if the selected memory cell has not yet been programmed, the precharged bit line BL is discharged by an evaluation operation, and so the sense node SO is discharged to a low voltage level. Next, the precharge or discharge state of the sense node SO is sensed using a second latch unit 40, and a verification operation is then performed (②).

In the program verification operation using the known page buffer, if the selected memory cell is a program-inhibited cell that should maintain an erase state, the bit line BL precharged to a high voltage level is discharged during the evaluation operation. Accordingly, if a number of program-inhibited cells exist within one page, the amount of current discharged is increased. An excessive increase in the amount of discharged current causes a malfunction of the device and requires a number of the sense nodes SO and the bit lines to be always precharged. It leads to an increase in the consumption of current during a program verification operation.

BRIEF SUMMARY

Exemplary embodiments relate to a method of performing a program verification operation using the page buffer of a nonvolatile memory device, which is capable of reducing the consumption of current by skipping a precharge operation for a bit line coupled to program-inhibited cells during a verification operation.

According to an aspect of the present disclosure, there is provided a method of performing a program verification operation in a nonvolatile memory device, including storing program data, programmed into a selected memory cell of a memory cell block, in a page buffer which is coupled to a bit line of the memory cell block via a sense node, controlling a voltage level of the sense node in response to a value of the program data, changing the voltage level of the sense node in response to a program state of the selected memory cell coupled to the bit line, and performing a program verification operation on the selected memory cell by sensing the voltage level of the sense node.

In the above method, the controlling of a voltage level of the sense node in response to the value of the program data may include precharging the sense node to a high voltage level or maintaining the sense node at a low voltage level in response to the value of the program data.

In the above method, the controlling of a voltage level of the sense node in response the value of to the program data may include maintaining the sense node at a low voltage level if the value of the program data corresponds to a program cell and precharging the sense node to a high voltage level if the value of the program data corresponds to an erase cell.

In the above method, controlling a voltage level of the sense node in response to the value of the program data may include coupling the sense node and a latch unit of the page buffer in which the program data are stored and controlling the voltage level of the sense node.

According to another aspect of the present disclosure, there is provided a method of performing a program verification operation using a page buffer of a nonvolatile memory device, including a bit line selection unit configured to couple a sense node of the page buffer and a bit line coupled to memory cells together, a first latch unit coupled to the sense node and configured to precharge the sense node in response to a value of program data; and a second latch unit coupled to the sense node and configured to perform a verification operation by sensing the sense node. Here, the method may include storing the program data in the first latch unit, precharging or discharging the sense node in response to a value of the program data, coupling the sense node and the bit line together using the bit line selection unit and performing an evaluation operation, and sensing a voltage level of the sense node and storing a sensed voltage level in the second latch unit.

If the value of the program data corresponds to program cell data, the sense node may be precharged to a high voltage level. If the value of the program data corresponds to erase cell data, the sense node may be discharged to a low voltage level.

During the evaluation operation, if the memory cell has been programmed, the sense node may be maintained at a high voltage level, and if the memory cell has not yet been programmed, the sense node may be discharged to a low voltage level.

According to yet another aspect of the present disclosure, there is provided an apparatus for performing a program verification operation in a nonvolatile memory device, the apparatus including a storing unit configured to store program data, programmed into a selected memory cell of a memory cell block, in a page buffer which is coupled to a bit line of the memory cell block via a sense node, a controlling unit configured to control a voltage level of the sense node in response to a value of the program data, a changing unit configured to change the voltage level of the sense node in response to a program state of the selected memory cell coupled to the bit line, and a performing unit configured to perform a program verification operation on the selected memory cell by sensing the voltage level of the sense node.

The controlling unit configured to control the voltage level of the sense node in response to the value of the program data may include a sensing unit configured to precharge the sense node to a high voltage level or maintain the sense node at a low voltage level in response to the value of the program data.

The controlling unit configured to control the voltage level of the sense node in response the value of to the program data may include a sensing unit configured to maintain the sense node at a low voltage level if the value of the program data corresponds to a program cell and precharge the sense node to a high voltage level if the value of the program data corresponds to an erase cell.

The controlling unit configured to control the voltage level of the sense node in response to the value of the program data may include a coupling unit configured to couple the sense node and a latch unit of the page buffer in which the program data are stored and control the voltage level of the sense node.

BRIEF DESCRIPTION OF THE DRAWINGS

FIG. 3 is a flowchart illustrating a method of performing a program verification operation using the page buffer according to an embodiment of this disclosure.

DESCRIPTION OF EMBODIMENTS

Hereinafter, exemplary embodiments of the present disclosure will be described in detail with reference to the accompanying drawings. The figures are provided to allow those having ordinary skill in the art to understand the scope of the embodiments of the disclosure.

Figure 1:
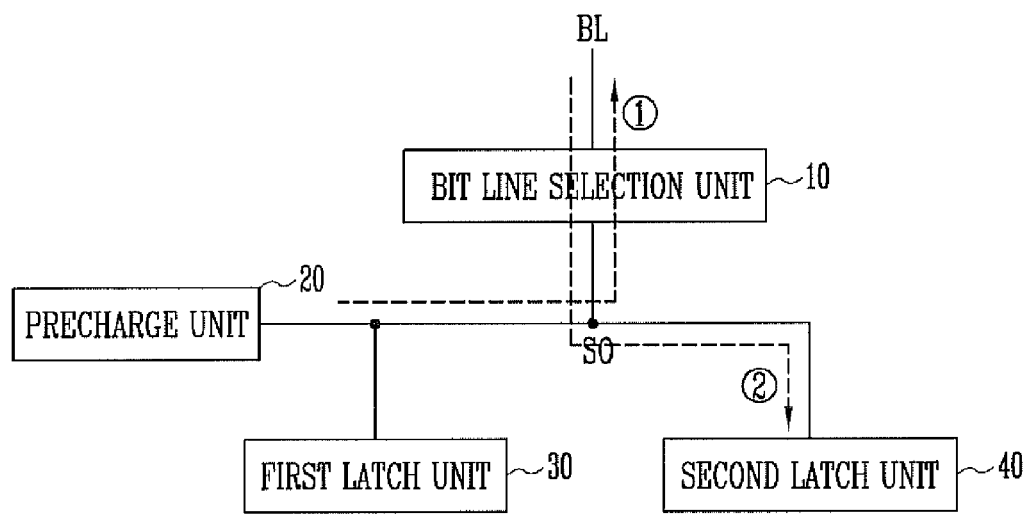
FIG. 1 is a diagram illustrating the page buffer of a known nonvolatile memory device and a method of performing a program verification operation using the same.
Figure 2:
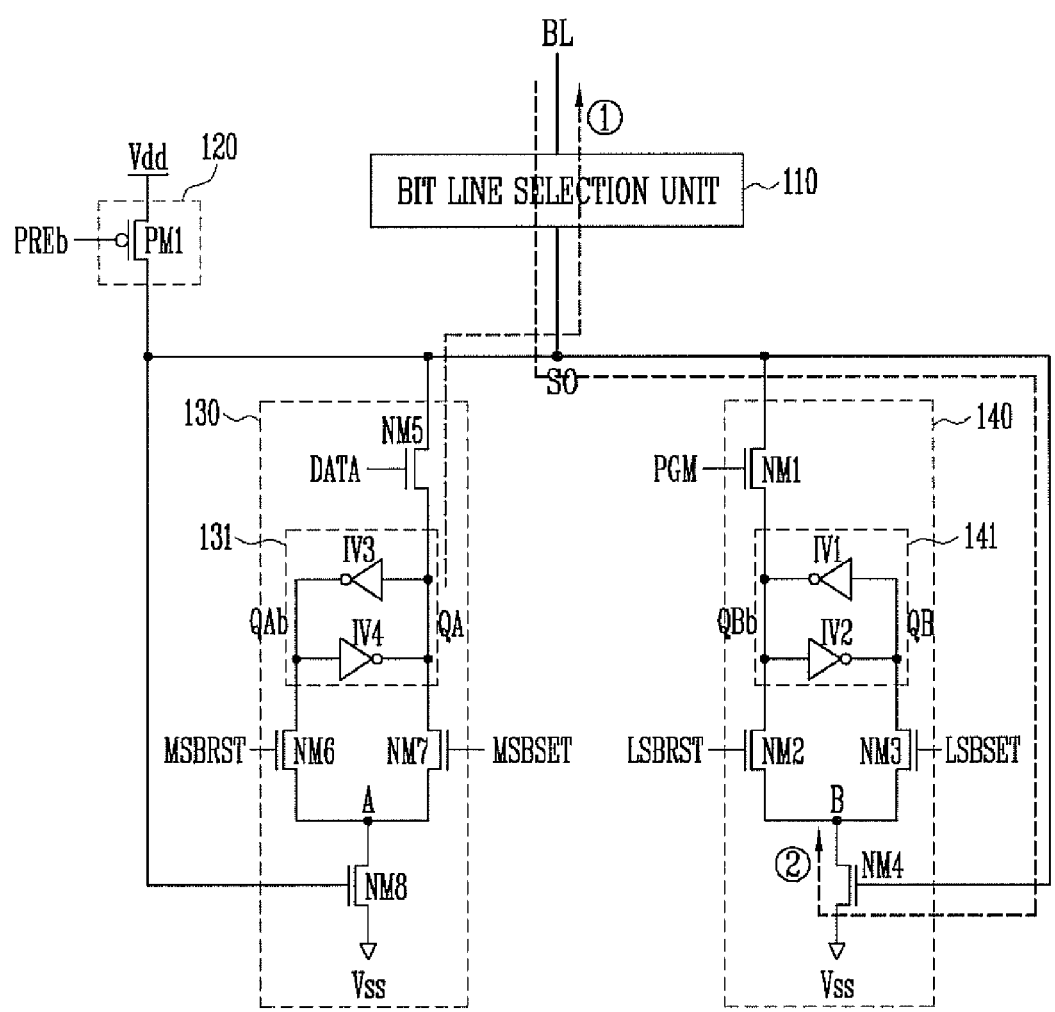
FIG. 2 is a circuit diagram of a page buffer according to an embodiment of this disclosure.

FIG. 2 is a circuit diagram of a page buffer according to an embodiment of this disclosure.

Referring to FIG. 2, the page buffer includes a bit line selection unit 110, a precharge unit 120, and first and second latch units 130 and 140.

The bit line selection unit 110 is configured to couple a sense node SO to a bit line BL.

The precharge unit 120 is configured to precharge the sense node SO to a high voltage level during a reset operation and a data input operation. The precharge unit 120 may include a PMOS transistor PM1 coupled between the sense node SO and a terminal for a power source voltage Vdd. The PMOS transistor PM1 is configured to supply the power source voltage Vdd to the sense node SO in response to a precharge signal PREb of a low level so that the sense node SO is precharged.

The first latch unit 130 is configured to precharge the sense node SO or to skip the precharge operation in response to a value of data to be programmed during a program verification operation.

The first latch unit 130 includes a latch 131 and a number of NMOS transistors NM5 to NM8. The latch 131 includes inverters IV3 and IV4 coupled together in a reverse direction between a first node QA and a second node QAb. The NMOS transistor NM5 is coupled between the sense node SO and the first node QA and is configured to precharge the sense node SO using a voltage level of the first node QA in response to a control signal DATA during a program verification operation. Here, if the first node QA is in a low voltage level, the sense node SO is not precharged. The NMOS transistor NM6 and the NMOS transistor NM7 are coupled between a common node A and the second node QAb and between the common node A and the first node QA, respectively. The NMOS transistor NM6 and the NMOS transistor NM7 are configured to input data to the latch 131 in response to a reset signal MSBRST and a set signal MSBSET, respectively. The NMOS transistor NM8 is coupled between the common node A and a terminal for a ground power source Vss. The NMOS transistor NM8 is turned on in response to a voltage level of the sense node SO, thereby coupling the common node A and the terminal for the ground power source Vss together.

The second latch unit 140 is configured to temporarily store program data during a program operation. The second latch unit 140 senses a voltage level of the sense node SO and verifies a program operation by comparing the program data and sensed data during a program verification operation.

The second latch unit 140 includes a latch 141 and a number of NMOS transistors NM1 to NM4. The latch 141 includes inverters IV1 and IV2 coupled together in a reverse direction between a third node QB and a fourth node QBb. The NMOS transistor NM1 is coupled between the sense node SO and the fourth node QBb and is configured to couple the sense node SO to the fourth node QBb in response to a program signal PGM. The NMOS transistor NM2 and the NMOS transistor NM3 are coupled between the fourth node QBb and a common node B and between the third node QB and the common node B, respectively. The NMOS transistor NM2 and the NMOS transistor NM3 are configured to input data to the latch 141 in response to a reset signal LSBRST and a set signal LSBSET, respectively. The NMOS transistor NM4 is coupled between the common node B and the terminal for the ground power source Vss. The NMOS transistor NM4 is turned on in response to a voltage level of the sense node SO, thereby coupling the common node B to the terminal for the ground power source Vss.

FIG. 3 is a flowchart illustrating a method of performing a program verification operation using the page buffer according to an embodiment of this disclosure.

The method of performing a program verification operation using the page buffer according to the embodiment of the present disclosure will be described hereinafter with reference to FIGS. 2 and 3.

The sense node SO is precharged to a high voltage level using the precharge unit 120. Next, the second node QAb is precharged to a low voltage level and the first node QA is precharged to a high voltage level by supplying the reset signal MSBRST to the first latch unit 130 so that program data are inputted to the first latch unit 130. Next, when the control signal DATA is inputted to the first latch unit 130, the precharged sense node SO maintains the voltage high level, and so the NMOS transistor NM4 of the second latch unit 140 is turned on. Here, the set signal LSBSET is supplied to the second latch unit 140 so that the third node QB and the common node B are coupled together. Thus, the program data stored in the first latch unit 130 is transferred to the second latch unit 140. Next, the sense node SO is precharged to a high voltage level using the precharge unit 120. Next, the bit line selection unit 110 couples the bit line BL to the sense node SO. Next, the program signal PGM is supplied to the second latch unit 140, thereby coupling the sense node SO to the third node QB. Accordingly, the sense node SO is maintained at the high voltage level or discharged to a low voltage level. Next, a program operation is performed by supplying a program voltage to a word line coupled to a selected memory cell.

During the above program operation, the program data remain in the first latch unit 130 and the second latch unit 140. In more detail, in the case where the selected memory cell is a cell to be programmed during the program operation, the first node QA of the latch 131 has a high voltage level. Meanwhile, in the case where the selected memory cell is a program-inhibited cell during the program operation, the first node QA of the latch 131 has a low voltage level.

Furthermore, in the case where the selected memory cell is a cell to be programmed during the program operation, the third node QB of the latch 141 has a low voltage level. Meanwhile, in the case where the selected memory cell is a program-inhibited cell during the program operation, the third node QB of the latch 141 has a high voltage level.

As described above, during the program operation, the program data are stored in the first latch unit 130 at step 310.

A program verification operation posterior to the program operation will be described hereinafter.

In the case where the selected memory cell is a cell to be programmed during the program operation, the first node QA of the latch 131 has a high voltage level. Here, the first node QA and the sense node SO are coupled together by supplying the control signal DATA to the first latch unit 130 so that the sense node SO is precharged to the high voltage level. In other words, a voltage level of the sense node SO is controlled in response to a value of the program data at step 320.

Next, the bit line BL and the sense node SO are coupled together using the bit line selection unit 110 (①) at step 330. At this time, a verification voltage is supplied to a memory cell selected from a number of memory cells coupled to the bit line BL, and a pass voltage is supplied to the remaining unselected memory cells. In this case, if the selected memory cell is programmed to have an increased threshold voltage, the corresponding memory cell becomes an off cell, and so the bit line BL maintains the high voltage level. If the selected memory cell has not yet been programmed, the precharged bit line BL is discharged through an evaluation operation. Thus, the precharged sense node SO is discharged to a low voltage level. Next, the precharge or discharge state of the sense node SO is sensed using the second latch unit 140, and a verification operation is then performed (②). Here, the sense operation is performed by supplying the reset signal LSBRST to the second latch unit 140 in order to turn on the NMOS transistor NM2 and by determining whether a value of data stored in the latch 141 is maintained without change or changed in response to the NMOS transistor NM4 which is turned on or off in response to a voltage level of the sense node SO at step 340.

In the case where the selected memory cell is a program-inhibited cell during the program operation (i.e., the selected memory cell is sought to be in an erase state), the first node QA of the first latch unit 130 has a low voltage level. Accordingly, although the first node QA and the sense node SO are coupled together by supplying the control signal DATA to the first latch unit 130, the sense node SO is not precharged a high voltage level at step 320. As described above, in the case where a selected memory cell is a program-inhibited cell, an operation of precharging a bit line is skipped during a program verification operation. Accordingly, the consumption of current can be reduced. Further, in the case where a selected memory cell is a program-inhibited cell, a bit line is discharged to a low voltage level during a program verification operation. Accordingly, a precharge operation is not required.

Next, the sense node SO and the bit line BL are coupled together using the bit line selection unit 110 at step 330. At this time, a precharge operation for the sense node SO is skipped, and so the sense node SO has a low voltage level. Further, since the bit line BL has a low voltage level, current does not flow through the sense node SO and the bit line BL during an evaluation operation.

According to the present disclosure, when a verification operation is performed on a nonvolatile memory device, a precharge operation for a bit line coupled to a program-inhibited cell may be skipped. Accordingly, the consumption of current can be reduced.

What is claimed is:

1. A method of performing a program verification operation in a nonvolatile memory device, the method comprising:
    storing program data, programmed into a selected memory cell of a memory cell block, in a page buffer which is coupled to a bit line of the memory cell block via a sense node;
    controlling a voltage level of the sense node in response to a value of the program data;
    changing the voltage level of the sense node in response to a program state of the selected memory cell coupled to the bit line; and
    performing a program verification operation on the selected memory cell by sensing the voltage level of the sense node.

2. The method of claim 1, wherein the controlling of the voltage level of the sense node in response to the value of the program data comprises precharging the sense node to a high voltage level or maintaining the sense node at a low voltage level in response to the value of the program data.

3. The method of claim 1, wherein the controlling of the voltage level of the sense node in response to the value of the program data comprises maintaining the sense node at a low voltage level if the value of the program data corresponds to a program cell, and precharging the sense node to a high voltage level if the value of the program data corresponds to an erase cell.

4. The method of claim 1, wherein the controlling of the voltage level of the sense node in response to the value of the program data comprises coupling the sense node and a latch unit of the page buffer in which the program data are stored and controlling the voltage level of the sense node.

5. A method of performing a program verification operation using a page buffer of a nonvolatile memory device, comprising a bit line selection unit configured to couple a sense node of the page buffer and a bit line coupled to memory cells together, a first latch unit coupled to the sense node and configured to precharge the sense node in response to a value of program data, and a second latch unit coupled to the sense node and configured to perform a verification operation by sensing the sense node, the method comprising:
    storing the program data in the first latch unit;
    precharging or discharging the sense node in response to a value of the program data;
    coupling the sense node and the bit line together using the bit line selection unit and performing an evaluation operation; and
    sensing a voltage level of the sense node and storing a sensed voltage level in the second latch unit.

6. The method of claim 5, wherein:
if the value of the program data corresponds to program cell data, the sense node is precharged to a high voltage level, and
if the value of the program data corresponds to erase cell data, the sense node is discharged to a low voltage level.

7. The method of claim 5, wherein during the evaluation operation, if the memory cell has been programmed, the sense node is maintained at a high voltage level, and if the memory cell has not yet been programmed, the sense node is discharged to a low voltage level.

8. The method of claim 5, wherein the precharging or discharging of the sense node in response to a value of the program data comprises coupling the first latch unit in which the program data are stored to the sense node and precharging the sense node to a high voltage level or maintaining the sense node at a low voltage level.

9. An apparatus for performing a program verification operation in a nonvolatile memory device, the apparatus comprising:
a storing unit configured to store program data, programmed into a selected memory cell of a memory cell block, in a page buffer which is coupled to a bit line of the memory cell block via a sense node;
a controlling unit configured to control a voltage level of the sense node in response to a value of the program data;
a changing unit configured to change the voltage level of the sense node in response to a program state of the selected memory cell coupled to the bit line; and
a performing unit configured to perform a program verification operation on the selected memory cell by sensing the voltage level of the sense node.

10. The apparatus of claim 9, wherein the controlling unit configured to control the voltage level of the sense node in response to the value of the program data comprises a sensing unit configured to precharge the sense node to a high voltage level or maintain the sense node at a low voltage level in response to the value of the program data.

11. The apparatus of claim 10, wherein the controlling unit configured to control the voltage level of the sense node in response the value of to the program data comprises a sensing unit configured to maintain the sense node at a low voltage level if the value of the program data corresponds to a program cell and precharge the sense node to a high voltage level if the value of the program data corresponds to an erase cell.

12. The method of claim 11, wherein the controlling unit configured to control the voltage level of the sense node in response to the value of the program data comprises a coupling unit configured to couple the sense node and a latch unit of the page buffer in which the program data are stored and control the voltage level of the sense node.

* * * * *